(12) United States Patent
Nishimura et al.

(10) Patent No.: US 7,755,203 B2
(45) Date of Patent: Jul. 13, 2010

(54) CIRCUIT SUBSTRATE AND SEMICONDUCTOR DEVICE

(75) Inventors: Takao Nishimura, Kawasaki (JP); Kazuyuki Aiba, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 456 days.

(21) Appl. No.: 11/708,027

(22) Filed: Feb. 20, 2007

(65) Prior Publication Data

US 2008/0042300 A1  Feb. 21, 2008

(30) Foreign Application Priority Data

Aug. 18, 2006  (JP) .............................. 2006-222825

(51) Int. Cl.
*H01L 29/00* (2006.01)
(52) U.S. Cl. ........................ 257/778; 257/782; 438/118; 438/119
(58) Field of Classification Search ................. 257/778, 257/782–785; 438/108, 118, 119
See application file for complete search history.

(56) References Cited

U.S. PATENT DOCUMENTS 6,614,111 B2 *  9/2003  Iwatsu et al. ................ 257/737
7,008,820 B2 *  3/2006  Shim et al. .................. 438/108
7,300,865 B2 * 11/2007  Hsieh et al. ................. 438/612

FOREIGN PATENT DOCUMENTS

| JP | 60-262430 A | 12/1985 |
| JP | 9-97816 A | 4/1997 |
| JP | 2003-338666 A | 11/2003 |
| JP | 2005-33142 A | 2/2005 |
| JP | 2006-32872 A | 2/2006 |

* cited by examiner

*Primary Examiner*—Zandra Smith
*Assistant Examiner*—Paul E Patton
(74) *Attorney, Agent, or Firm*—Westerman, Hattori, Daniels & Adrian, LLP

(57) ABSTRACT

A circuit substrate for improving the reliability and productivity of a semiconductor device, and that semiconductor device. In a circuit substrate to which a semiconductor element is to be flip-chip mounted, at least one island-shaped electrically conductive layer is selectively disposed together with a wiring layer at an element mounting area where the semiconductor element is to be mounted, and an insulating resin layer is disposed over the island-shaped electrically conductive layer. The semiconductor element is secured at the element mounting area to the circuit substrate by an adhesion material to make a semiconductor device. With this, delaminating of the wiring layer inside the semiconductor device is suppressed, and the damage of an electrode is suppressed. The circuit substrate has high reliability and the semiconductor device, having the circuit substrate, is implemented.

15 Claims, 9 Drawing Sheets

CIRCUIT SUBSTRATE AND SEMICONDUCTOR DEVICE

CROSS-REFERENCE TO RELATED APPLICATIONS

This application is based upon and claims the benefits of priority from the prior Japanese Patent Application No. 2006-222825, filed on Aug. 18, 2006, the entire contents of which are incorporated herein by reference.

BACKGROUND OF THE INVENTION

1. Field of the Invention

The present invention relates to circuit substrates and semiconductor devices, and particularly to a circuit substrate to which a semiconductor element is to be flip-chip connected in a face-down structure and a semiconductor device in which the semiconductor element is flip-chip connected in the face-down structure to the circuit substrate.

2. Description of the Related Art

When a semiconductor element is mounted to a circuit substrate to make a semiconductor device, the semiconductor element may be flip-chip mounted to the circuit substrate in a face-down configuration, in which a main surface of the semiconductor element faces the circuit substrate, as one semiconductor-element mounting structure.

To implement this structure, a method (disclosed, for example, in Japanese Unexamined Patent Application Publication No. 9-97816) is used in which a load is applied to the semiconductor element, having bumps, toward the circuit substrate, having mounting pads, with an adhesive disposed therebetween to align the bumps with the mounting pads to make the bumps into contact with the mounting pads; and the adhesive is cured by heat while the bumps and mounting pads are contacting, to secure the semiconductor element to the circuit substrate to make the semiconductor device.

In the semiconductor device, manufactured by this method, the semiconductor element is secured to the circuit substrate with the adhesive supplied therebetween, and a state is maintained in which the bumps of the semiconductor element is pressed against the mounting pads of the circuit substrate. As a result, the mechanical contacts of the bumps and mounting pads are maintained, and their electrical contacts are also obtained and maintained.

In some cases, solid patterns are disposed in addition to wiring patterns and the mounting pads at an area (hereinafter called an element mounting area) where the semiconductor element is mounted to the circuit substrate (for example, see Japanese Unexamined Patent Application Publication No. 2003-338666).

It has been disclosed that placing such solid patterns increases the rigidity of the circuit substrate and improves the reliability of the semiconductor device; and in addition, plating the surfaces of the solid patterns with nickel (Ni) and gold (Au) increases the rigidity of the solid patterns, thus further improving the rigidity of the circuit substrate.

It has been also proposed that wiring patterns and dummy patterns are disposed at the element mounting area in the circuit substrate to eliminate non-uniformity of the density of patterns to prevent warping of the circuit substrate caused by a difference in thermal expansion coefficients (for example, in Japanese Unexamined Patent Application Publication No. 2006-32872).

In the above-described related-art cases, the wiring patterns and dummy patterns are plated with gold (Au) to increase corrosion resistance. However, since a gold (Au) plating layer has low contact performance with adhesives, a sufficient contact force is not obtained. Therefore, it is difficult to maintain the contacts between wiring patterns and connection terminals of the semiconductor element. To solve this problem, in the related-art cases, the dummy patterns have branch shapes to form small protrusions, that is, a plurality of indentations and projections, to increase the contact force by an anchor effect.

As described above, generally, a low contact force is provided between metals such as gold (Au) and adhesives. Therefore, delaminating is likely to occur at the interface between an adhesive and the gold (Au) plating layers disposed over the surfaces of the dummy patterns and solid patterns, after mounting.

As a result, it is difficult to maintain a state in which the bumps of the semiconductor element is pressed against the mounting pads of the circuit substrate, and satisfactory electrical connections are not maintained therebetween. Especially when the semiconductor device is left in an environment of a high temperature and a high humidity, delaminating further advances and desired reliability is not obtained.

One method can be considered in which insulating resin layers, which have high contact performance with adhesives, are disposed over the dummy patterns (solid patterns). When the dummy patterns (solid patterns) have a large area at the element mounting area, the insulating resin layers also have a large area.

Having a large area, the insulating resin layers have a large elastic recovery force. Therefore, when the semiconductor element is mounted to the circuit substrate, if there are insulating resin layers having a large area at the element mounting area, the elastic recovery force of the insulating resin layers exceeds a bonding load even if the bonding load is applied to the semiconductor element, making the connections between the bumps of the semiconductor element and the mounting pads of the circuit substrate unstable.

If an increased load is applied to the semiconductor element to make the bonding process reliable, internal wiring or circuit elements at portions where the bumps are formed in the semiconductor element may be damaged.

SUMMARY OF THE INVENTION

In view of the foregoing, it is an object of the present invention to provide the structure of a circuit substrate having high reliability and a semiconductor device that includes the circuit substrate, to prevent delaminating between electrodes and damage in a semiconductor element.

To accomplish the above object, according to the present invention, there is provided a circuit substrate to which a semiconductor element is mounted. The circuit substrate includes a. wiring layer disposed at an area opposite the semiconductor element in a surface of the circuit substrate, an electrically conductive layer disposed apart from the wiring layer at the area opposite the semiconductor element in the surface of the circuit substrate, and a resin layer disposed over the electrically conductive layer.

To accomplish the above object, according to the present invention, there is provided a semiconductor device. The semiconductor device includes a semiconductor element; a circuit substrate to which the semiconductor element is mounted, including a wiring layer disposed at an area opposite the semiconductor element, an electrically conductive layer disposed apart from the wiring layer at the area opposite the semiconductor element, and a resin layer disposed over the electrically conductive layer; and an adhesion material disposed between the circuit substrate and the semiconductor element.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

Figure 1A:
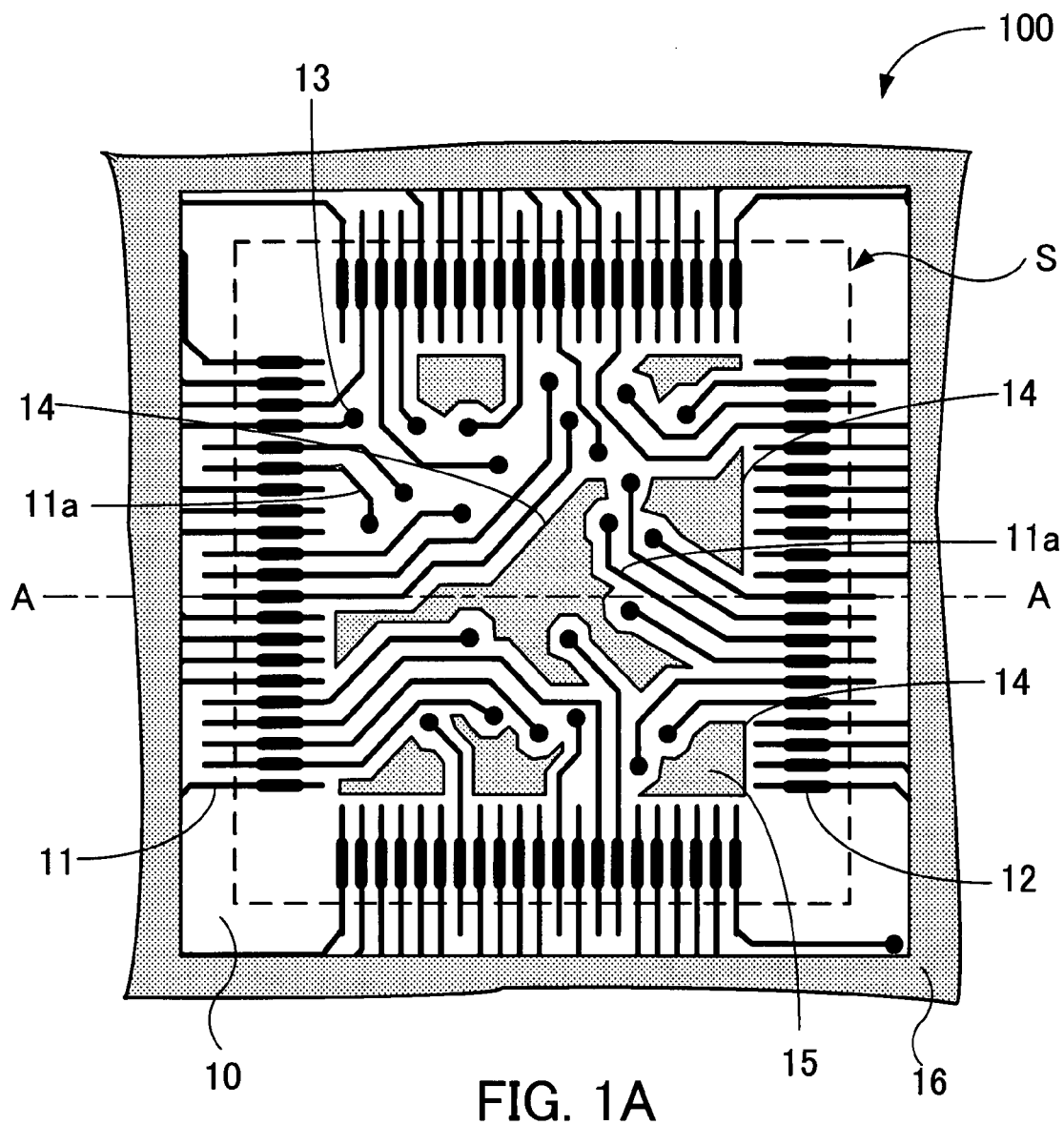
FIG. 1A is a plan of a circuit substrate according to a first embodiment of the present invention.

Embodiments of the present invention will be described below in detail by referring to the drawings.

First Embodiment

A circuit substrate and a, form in which a semiconductor element is mounted over the circuit substrate to make a semiconductor device, according to a first embodiment of the present invention will be described.

Figure 1B:
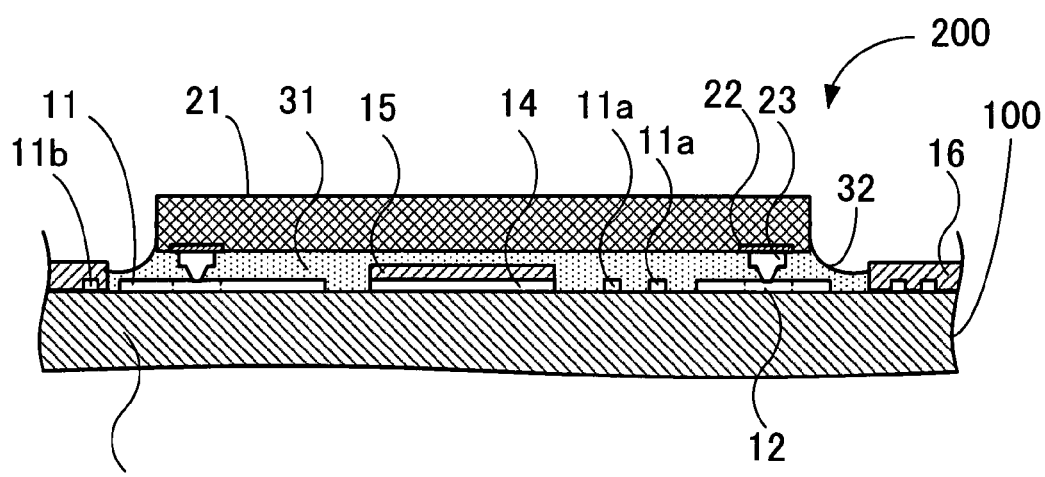
FIG. 1B is a cross-sectional view of a main part obtained when a semiconductor element is mounted to the circuit substrate.

FIG. 1A shows the structure of a circuit substrate 100 according to the first embodiment, and FIG. 1B shows a state in which a semiconductor element 21 is flip-chip (face-down) mounted over the circuit substrate 100 to make a semiconductor device 200. FIG. 1B is a cross-sectional view corresponding to that taken along line A-A in FIG. 1A.

In FIG. 1A, a rectangular area S enclosed by a dotted line in the circuit substrate 100 indicates a plane location to be occupied by the semiconductor element 21 when it is mounted. Hereinafter, the rectangular area S is called an element mounting area S.

Over a surface of an insulating base member 10 constituting the circuit substrate 100, a plurality of wiring layers 11 is disposed selectively at each of the four sides of the element mounting area S.

In the element mounting area S, wide electrode connection sections 12 are provided for the plurality of wiring layers 11 in vicinities of the perimeter of the area S. Electrodes of the semiconductor element 21 are connected to the wide electrode connection sections 12.

To increase the wiring density in the circuit substrate 100, parts 11a of the wiring layers 11 are extended to vicinities of the center of the element mounting area S, and are electrically connected to wiring layers (not shown) formed in the rear surface or inside the insulating base member 10 through vias 13 for interlayer connections. The wiring layers 11a are not necessarily extended or arranged at a constant pitch or a uniform density in the element mounting area S.

In the present embodiment, island-shaped electrically conductive layers 14 are selectively disposed apart from the wiring layers 11a in an area having a low arrangement density of the wiring layers 11a. The island-shaped electrically conductive layers 14 are generally wider than the wiring layers 11 and their shapes are not specified. The island-shaped electrically conductive layers 14 are electrically connected to a ground potential part of the circuit substrate 100, if necessary. The island-shaped electrically conductive layers 14 are called dummy patterns in some cases as in the above-described related-art (Japanese Unexamined Patent Application Publication No. 2006-32872).

In the present embodiment, insulating resin layers 15 are disposed over the surfaces of the island-shaped electrically conductive layers 14. A solder-resist layer 16 is disposed to cover the surface of the insulating base member 10 and wiring layers 11b extending toward to the outside of the element mounting area S, slightly apart from the element mounting area S at the outside of the element mounting area S.

In the circuit substrate 100, which has the above-described structure, the insulating base member 10 is made from an organic insulating resin such as a glass-epoxy resin, a glass-bismaleimide-triazine (glass-BT) resin, or a polyimide. The insulating base member 10 may be made from an inorganic insulating material, such as ceramics or glass.

The insulating base member 10 can have a single-sided wiring structure, a double-sided wiring structure or a multi-layer wiring structure depending on its use. The circuit substrate 100 is also called a wiring substrate or an interposer.

The wiring layers 11, the wide electrode connection sections 12, and the island-shaped electrically conductive layers 14 are made, for example, from copper (Cu), and their surfaces are plated in two layers with nickel (Ni) and gold (Au) in that order from the lower layer. These metal layers are formed together by a combination of formation over the entire surface of the circuit substrate 100 and selection etching (so-called photolithography) or by a selection plating method to have a thickness of 7 to 20 μm.

As described above, the insulating resin layers 15 are disposed over the island-shaped electrically conductive layers 14 selectively disposed.

The insulating resin layers 15 can be made from the same material as that constituting the solder-resist layer 16. These layers can be made from a developing-type resist material, a thermosetting resist material, or an ultraviolet-curable resist material. More specifically, these layers can be made from a resin such as an epoxy resin, an acrylic resin, or a polyimide resin, or a mixture of these resins. The insulating resin layers 15 and the solder-resist layer 16 may be made from different materials.

The insulating resin layers 15 and the solder-resist layer 16 can be selectively disposed by a combination of forming these layers over target layers and photolithography processing applied to the target layers. The thickness of these layers is about 5 to 30 μm.

FIG. 1B shows the state in which the semiconductor element 21 is flip-chip mounted, with its face down, to the circuit substrate 100, having the above-described structure, to make the semiconductor device 200.

In the semiconductor device 200, the semiconductor element 21 is secured to the circuit substrate 100 with an adhesion material (adhesive) 31 filling between the semiconductor element 21 and the circuit substrate 100. The adhesion material 31 is also called an underfill material.

In the semiconductor element 21, a so-called wafer process is, applied to one main surface of a semiconductor base member made from silicon (Si), gallium arsenide (GaAs), or the like to form an electronic circuit having active elements such as transistors, passive elements such as capacitors, and wiring layers for connecting these elements.

Over the one main surface of the semiconductor base member, where the electronic circuit is formed, bumps (protruding electrodes) are disposed, as external-connection electrodes 23, over electrode pads 22 connected to the wiring layers. The electrode pads 22 are made from a metal having aluminum (Al) or copper as a main component.

The bumps, serving as the external-connection electrodes 23, are made from gold (Au), copper (Cu), an alloy of gold and copper, solder, or the like, and are formed by a ball bonding method which uses metal wires, a plating method, a printing method, a transfer method, and others.

The adhesion material 31 is a thermosetting adhesive made from an epoxy resin, a polyimide resin, an acrylic resin, or the like and is an insulator or is anisotropically electrically conductive. Before cured, the adhesion material 31 has either a paste-like shape or a sheet shape.

After adhesion treatment, the adhesion material 31 forms a fillet 32 from the side faces of the semiconductor element 21 to the side faces of the solder-resist layer 16.

In the semiconductor device 200, which has the above-described structure, the wiring layers 11 and the island-shaped electrically conductive layers 14 are selectively disposed at the element mounting area S in the circuit substrate 100, as described above.

The selective arrangement of the island-shaped electrically conductive layers 14 improves non-uniformity of the density of electrically conductive portions over the circuit substrate 100 and increases the rigidity of the circuit substrate 100 to reduce warpage or bow of the circuit substrate 100.

In the semiconductor device 200, since the insulating resin layers 15 are disposed over the surfaces of the island-shaped electrically conductive layers 14, the adhesion material 31 contacts the insulating resin layers 15. The island-shaped electrically conductive layers 14 and the adhesion material 31 are strongly connected through the insulating resin layers 15, and delaminating does not occur between the island-shaped electrically conductive layers 14 and the adhesion material 31.

Between the adjacent wiring layers 11 and between the wiring layers 11 and the island-shaped electrically conductive layers 14, the surface of the insulating base member 10 contacts the adhesion material 31. When the insulating base member 10 is made from an organic material, the contact performance between the insulating base member 10 and the adhesion material 31 is satisfactory.

Since uneven portions are formed depending on the thickness (height) of the wiring layers 11 and the island-shaped electrically conductive layers 14 between the adjacent wiring layers 11 and between the wiring layers 11 and the island-shaped electrically conductive layers 14, as the area where the adhesion material 31 contacts increases, a so-called anchor effect occurs, preventing delaminating between the wiring layers 11 and the adhesion material 31.

As described above, according to the present embodiment, delaminating does not occur at the interfaces of the adhesion material 31, and the wiring layers 11 and the island-shaped electrically conductive layers 14; and satisfactory mechanical contacts and satisfactory electrical contacts can be maintained between the electrode connection sections 12 of the circuit substrate 100 and the external-connection electrodes 23 of the semiconductor element 21.

The insulating resin layers 15 are selectively disposed only over the island-shaped electrically conductive layers 14.

Therefore, the area occupied by the insulating resin layers 15 in the element mounting area S is substantially small, and the elastic recovery force of the insulating resin layers 15, which is generated when the semiconductor element 21 is mounted to the circuit substrate 100, is small.

Consequently, a load applied to the semiconductor element 21 exceeds the elastic recovery force of the insulating resin layers 15 even if the load is not made large, and the electrode connection sections 12 of the circuit substrate 100 and the external-connection electrodes 23 of the semiconductor element 21 can be connected in a stable state.

Since the load applied to the semiconductor element 21 does not need to be made large, internal wirings or functional elements at portions where the external-connection electrodes 23 of the semiconductor element 21 are disposed are not damaged.

Therefore, even when the semiconductor element 21 is pressed against the circuit substrate 100 through the thermosetting adhesion material 31 with the load and heat supplied, the internal wirings or internal elements of the semiconductor element 21 are not damaged, and the electrode connection sections 12 of the circuit substrate 100 and the external-connection electrodes 23 of the semiconductor element 21 are reliably connected. In other words, the semiconductor device 200 has high reliability.

Next, a semiconductor-device manufacturing method that includes a process for mounting the semiconductor element 21 to the circuit substrate 100 will be described with reference to FIG. 2 to FIG. 5.

Figure 2:
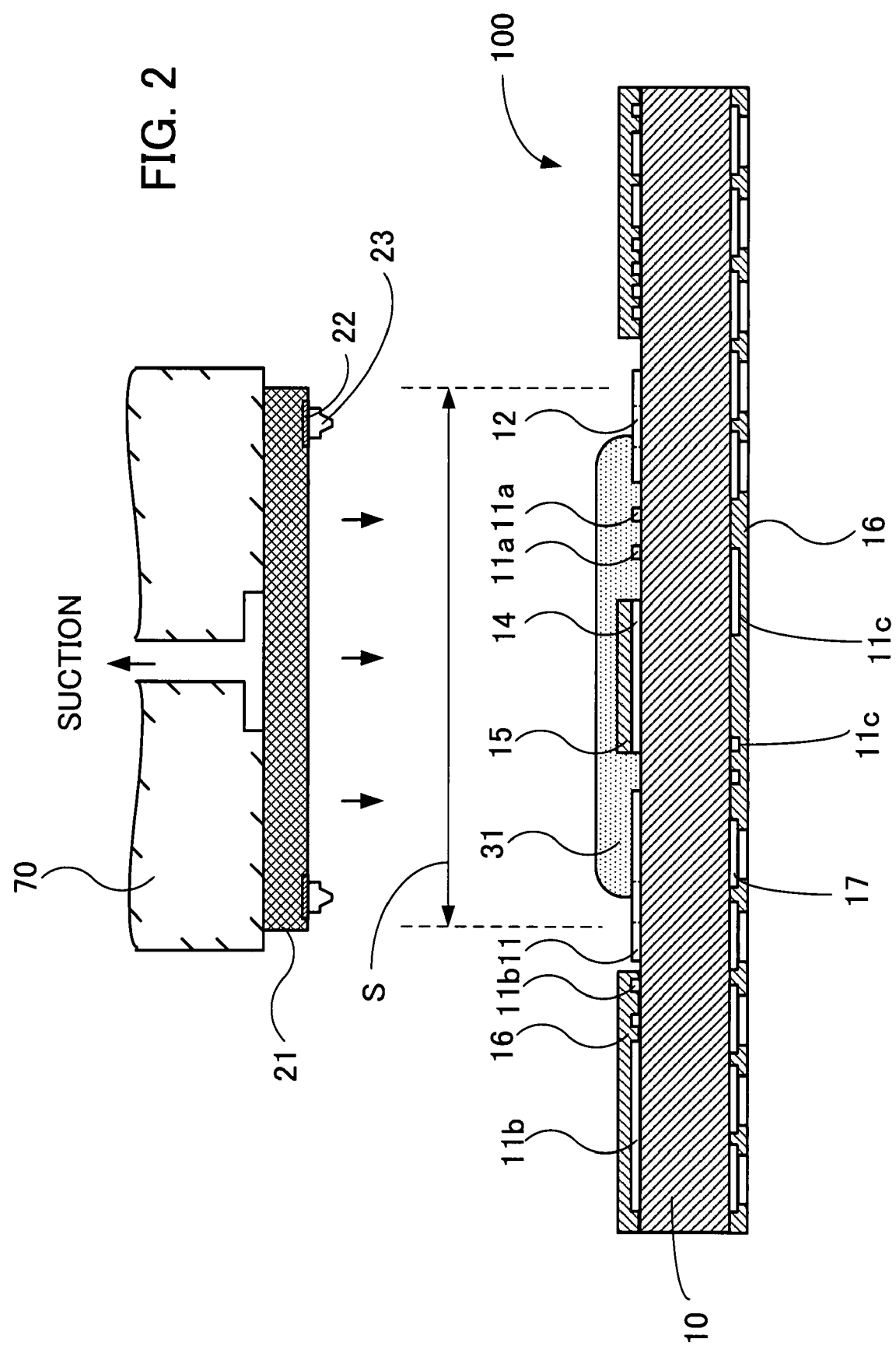
FIG. 2 is a cross-sectional view of a main part used in a first stage in a process for mounting the semiconductor element to the circuit substrate.

FIG. 2 shows a state where the semiconductor element 21 is placed over the circuit substrate 100.

As described above, the semiconductor element 21 is flip-chip mounted, with its face down, to the circuit substrate 100.

Before the semiconductor element 21 is mounted, the paste-like or sheet-shaped adhesion material 31 is supplied and disposed in the element mounting area S of the circuit substrate 100. A dispenser method, a printing method, or a pasting method can be used as the supplying method.

A plurality of electrode pads (electrode lands) 17 to which external-connection terminals of the circuit substrate 100 are to be disposed is disposed over the other main surface of the circuit substrate 100, which is the surface opposite the surface to which the semiconductor element 21 is mounted.

Around the plurality of electrode pads 17, wiring layers 11c are disposed, if necessary. The wiring layers 11c are covered by a solder-resist layer 16.

The wiring layers, electrode pads, and others disposed over both main surfaces of the circuit substrate 100 are selectively connected through wiring layers and interlayer connection sections formed inside the circuit substrate 100.

Since the other components of the circuit substrate 100 have been described by referring to FIG. 1B, a description thereof is omitted here.

The semiconductor element 21, where the external-connection electrodes 23 have been disposed at the electrode pads 22, is suctioned and held by a bonding tool 70 heated in advance. The heating temperature is set to about 150° C. to 250° C.

The circuit substrate 100 is suctioned and held over a bonding stage (not shown), and if necessary, the circuit substrate 100 and the adhesion material 31 are preparatorily heated. The heating temperature is set to about 50° C. to 100° C.

The semiconductor element 21 is placed to face the circuit substrate 100; the external-connection electrodes 23 of the semiconductor element 21 are positioned correspondingly to the electrode connection sections 12 of the circuit substrate 100; and the semiconductor element 21 is lowered toward the circuit substrate 100 in a direction indicated by arrows.

The semiconductor element 21 is lowered to the circuit substrate 100 to make the external-connection electrodes 23 of the semiconductor element 21 contact with the electrode connection sections 12 of the circuit substrate 100.

The bonding tool 70 applies pressure to the semiconductor element 21 to apply a load to the external-connection electrodes 23 of the semiconductor element 21, which has contacted the electrode connection sections 12 of the circuit substrate 100. The load is set, for example, to 5 to 50 gf/bump.

With the applied load, the adhesion material 31 flows outward, that is, toward the outside of the element mounting area S, between the semiconductor element 21 and the circuit substrate 100, and is cured by heat (at about 150° C. to 250° C.).

When the adhesion material 31 flows as described above, the solder-resist layer 16 serves as a dam for blocking unnecessary flow of the adhesion material 31. With this, the adhesion material 31 forms the fillet 32, which is stable.

Figure 3:
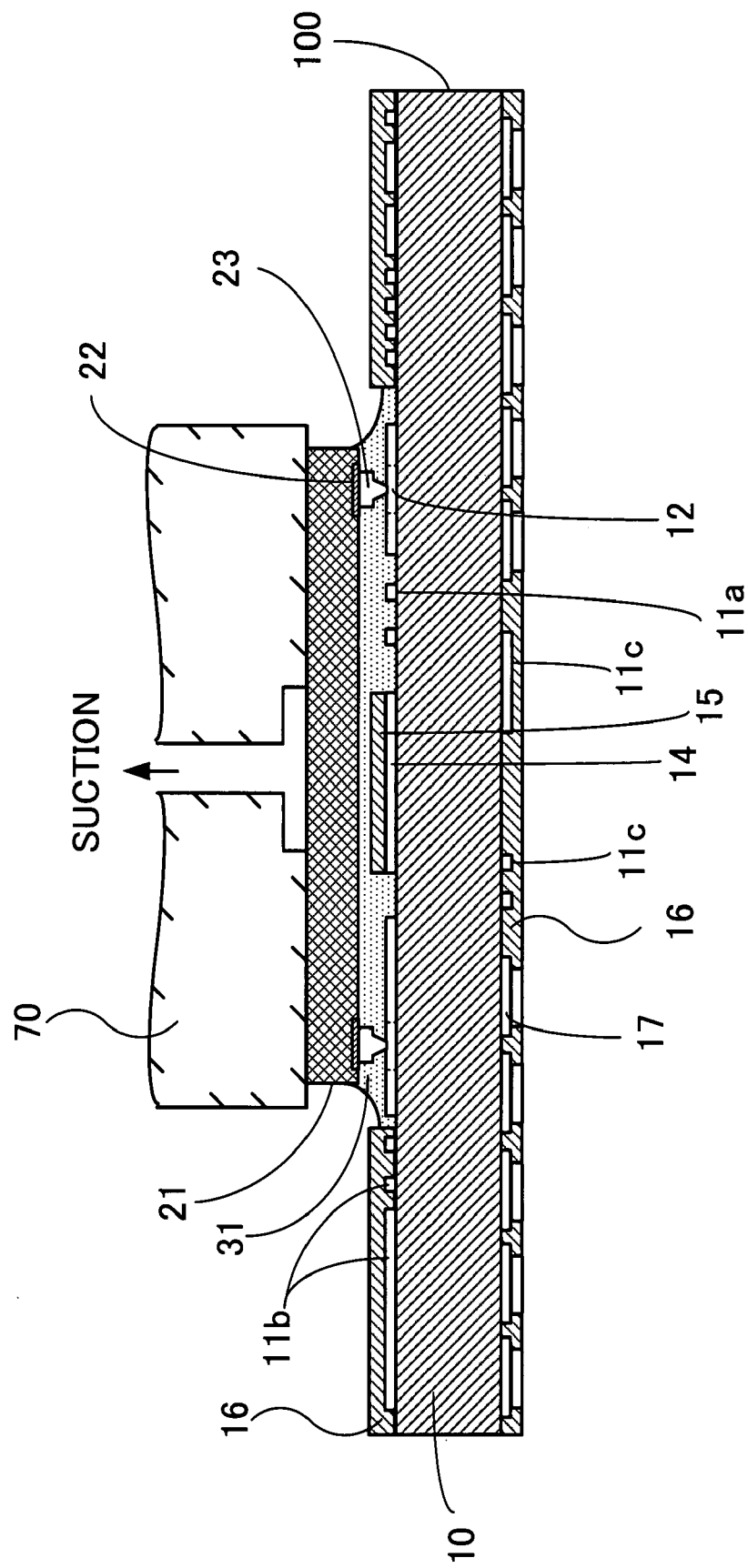
FIG. 3 is a cross-sectional view of a main part used in a second stage in the process for mounting the semiconductor element to the circuit substrate.

FIG. 3 shows the above-described state.

Then, the suction of the bonding tool 70 is released to separate the semiconductor element 21 from the bonding tool 70, and the bonding tool 70 is raised (not shown).

The circuit substrate 100 and the semiconductor element 21, which has been mounted and secure thereto, are subjected to heat treatment in an oven. The adhesion material 31 is completely cured and mounting the semiconductor element 21 to the circuit substrate 100 is finished.

Figure 4:
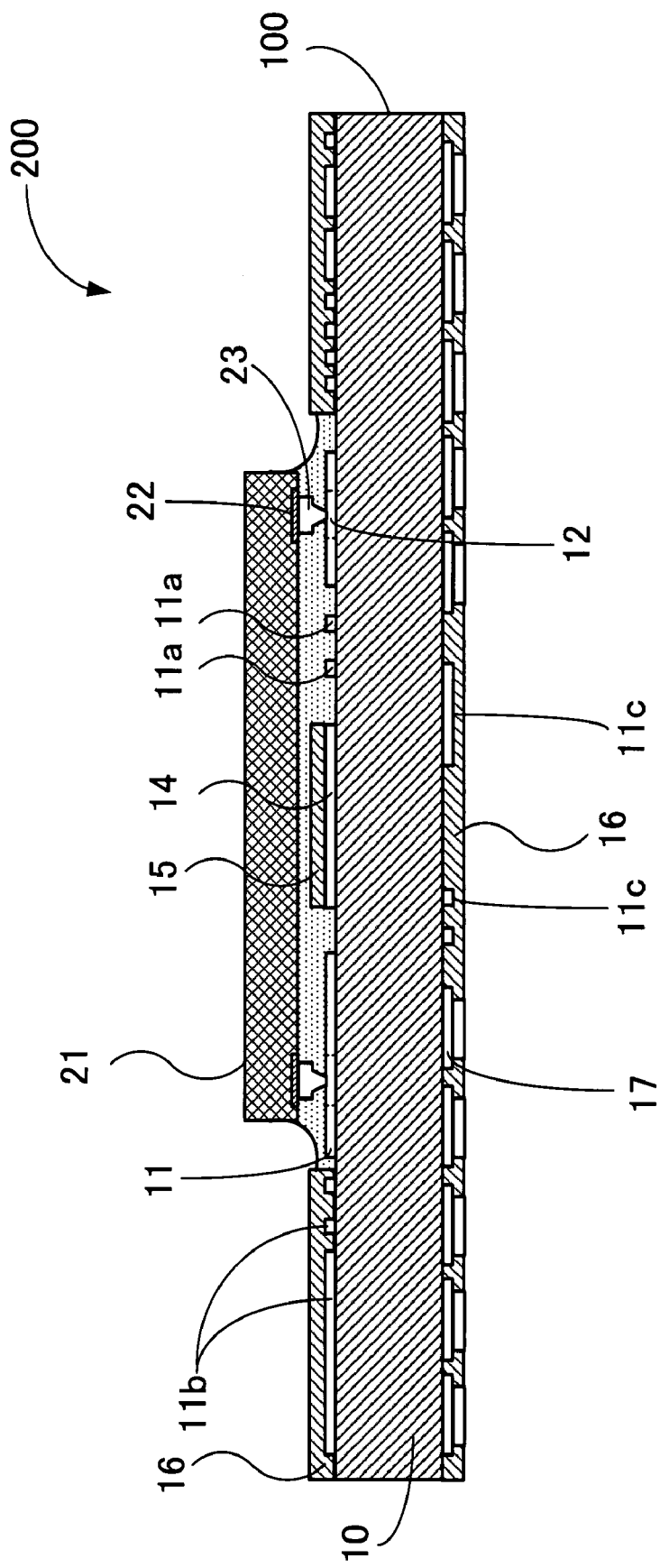
FIG. 4 is a cross-sectional view of a main part used in a third stage in the process for mounting the semiconductor element to the circuit substrate.

FIG. 4 shows the above-described state.

In this treatment, the heating temperature is set, for example, to 120° C. to 180° C., and the heating time is set, for example, to about 30 to 90 minutes.

In the process shown in FIG. 3, when the adhesion material 31 is cured, for example, at a curing rate of about 80%, the process shown in FIG. 4 can be omitted.

Then, solder balls serving as external-connection terminals 18 are formed over the electrode pads 17 disposed over the rear surface of the circuit substrate 100 by a reflow method to make the semiconductor device 200 having a ball-grid-array (BGA) package structure.

Figure 5:
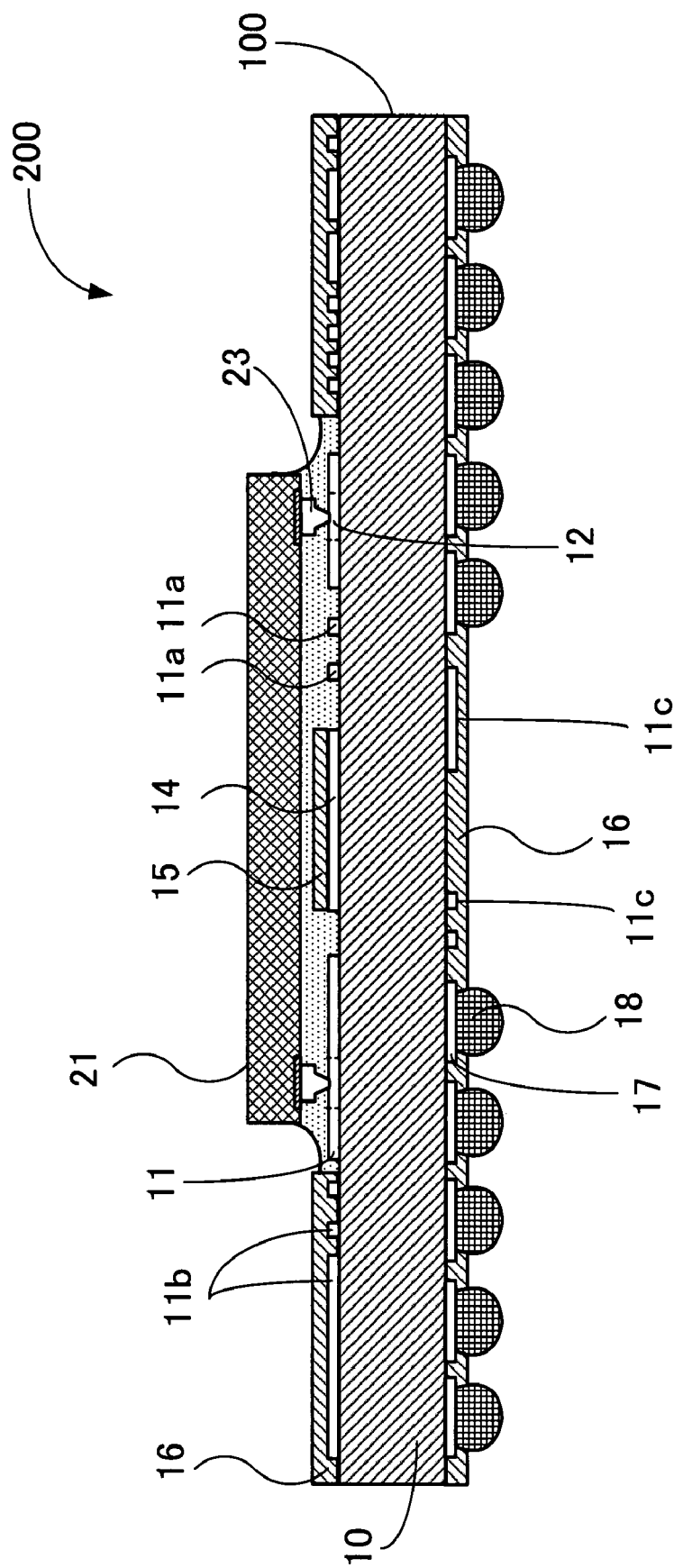
FIG. 5 is a cross-sectional view of a main part of a semiconductor device according to the present invention.

FIG. 5 shows the above-described state.

The arrangement of the solder balls may be omitted to make the semiconductor device 200 have a land-grid-array (LGA) package structure, which has the electrode pads 17 as external-connection terminals. The shape of the external-connection terminals may be another shape such as a lead shape or a pin shape.

The positions where the external-connection terminals 18 are disposed are not limited to those over the main surface-of the circuit substrate 100, opposite the surface where the semiconductor element 21 is mounted. The external-connection terminals 18 may be disposed over the main surface where the semiconductor element 21 is mounted or over a side face of the circuit substrate 100, if necessary.

A second embodiment of the present invention will be described next.

Second Embodiment

A circuit substrate and a form in which a semiconductor element is mounted over the circuit substrate to make a semiconductor device, according to a second embodiment of the present invention will be described.

Figure 6A:
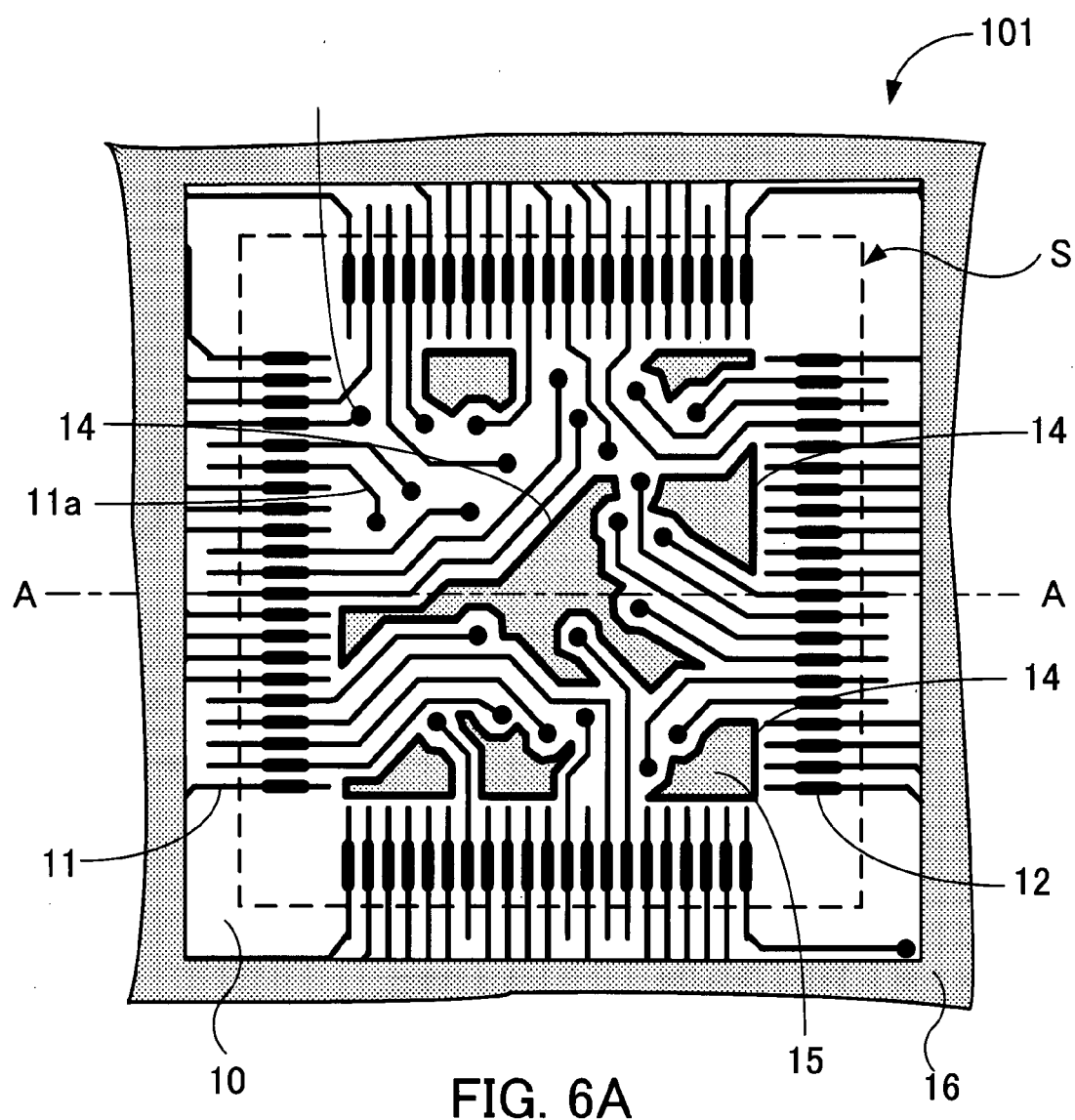
FIG. 6A is a plan of a circuit substrate according to a second embodiment of the present invention.
Figure 6B:
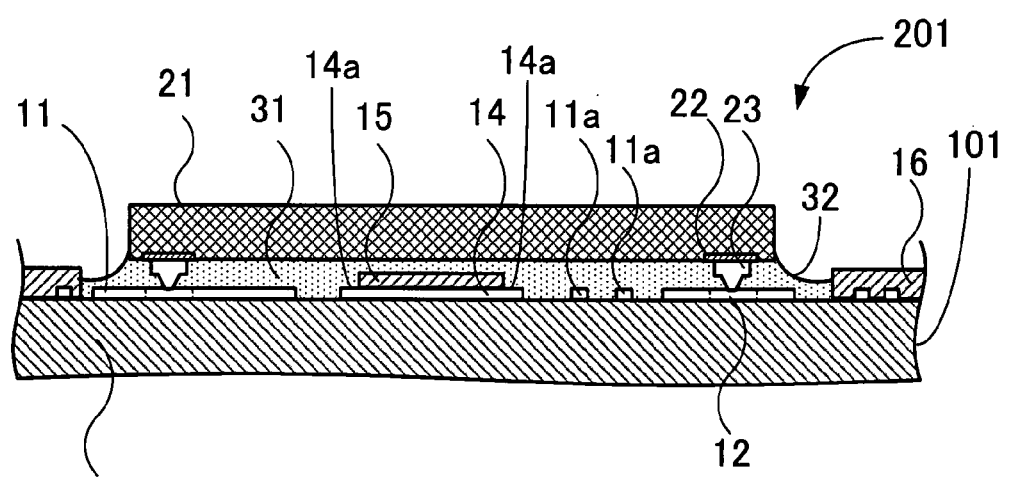
FIG. 6B is a cross-sectional view of a main part obtained when a semiconductor element is mounted to the circuit substrate.

FIG. 6A shows the structure of a circuit substrate 101 according to the second embodiment, and FIG. 6B shows a state in which a semiconductor element 21 is flip-chip (face-down) mounted over the circuit substrate 101 to make a semiconductor device 201. FIG. 6B is a cross-sectional view corresponding to that taken along line A-A in FIG. 6A.

In the semiconductor device 201 according to the second embodiment, exposure sections 14a are provided in island-shaped electrically conductive layers 14 selectively disposed over an insulating base member 10 of the circuit substrate 101 so as to expose upper edge surfaces of the island-shaped electrically conductive layers 14. Insulating resin layers 15 are selectively disposed over the other sections of the island-shaped electrically conductive layers 14.

The insulating resin layers 15 have smaller areas than the island-shaped electrically conductive layers 14. The exposure sections 14a have a width about the same as that of wiring layers 11.

The second embodiment has the same structure as the first embodiment except for how the insulating resin layers 15 are disposed over the island-shaped electrically conductive layers 14, and therefore, a detailed description of the same structure is omitted.

In the semiconductor device 201, which has the above-described structure, the wiring layers 11 and the island-shaped electrically conductive layers 14 are selectively disposed at an element mounting area S in the circuit substrate 101.

The selective arrangement of the island-shaped electrically conductive layers 14 improves non-uniformity of the density of electrically conductive portions over the circuit substrate 101 and increases the rigidity of the circuit substrate 101 to reduce warpage or bow of the circuit substrate 101.

In the semiconductor device 201, since the insulating resin layers 15 are disposed over surfaces of the island-shaped electrically conductive layers 14, an adhesion material 31 contacts the insulating resin layers 15. The island-shaped electrically conductive layers 14 and the adhesion material 31 are strongly connected through the insulating resin layers 15, and delaminating does not occur between the island-shaped electrically conductive layers 14 and the adhesion material 31.

Since the insulating resin layers 15 are selectively disposed partially over the island-shaped electrically conductive layers 14 with smaller areas than the island-shaped electrically conductive layers 14 in the semiconductor device 201, steps are formed between the island-shaped electrically conductive layers 14 and the insulating resin layers 15.

Therefore, when the adhesion material 31 is placed over the insulating base member 10 including the insulating resin layers 15, the contact performance of the adhesion material 31 and the insulating resin layers 15 is further improved due to an increase in the contact area caused by the steps.

Since the area of the insulating resin layers 15 disposed partially over the island-shaped electrically conductive layers 14 are restricted in the above-described structure, the elastic recovery force of the insulating resin layers 15 is suppressed to a lower level when the semiconductor element 21 is mounted to the circuit substrate 101.

Consequently, a load applied to the semiconductor element 21 exceeds the elastic recovery force of the insulating resin layers 15 even if the load is not made large, and electrode connection sections 12 of the circuit substrate 101 and external-connection electrodes 23 of the semiconductor element 21 can be connected in a stable state.

Since the load applied to the semiconductor element 21 does not need to be made large, internal wirings or functional elements at portions where the external-connection electrodes 23 of the semiconductor element 21 are disposed are not damaged.

Therefore, even when the semiconductor element 21 is pressed against the circuit substrate 101 through the thermosetting adhesion material 31 with the load and heat supplied, the internal wirings or internal elements of the semiconductor element 21 are not damaged, and the electrode connection sections 12 of the circuit substrate 101 and the external-connection electrodes 23 of the semiconductor element 21 are reliably connected. In other words, the semiconductor device 201 has high reliability.

A third embodiment of the present invention will be described next.

Third Embodiment

A circuit substrate and a form in which a semiconductor element is mounted over the circuit substrate to make a semiconductor device, according to a third embodiment of the present invention will be described.

Figure 7A:
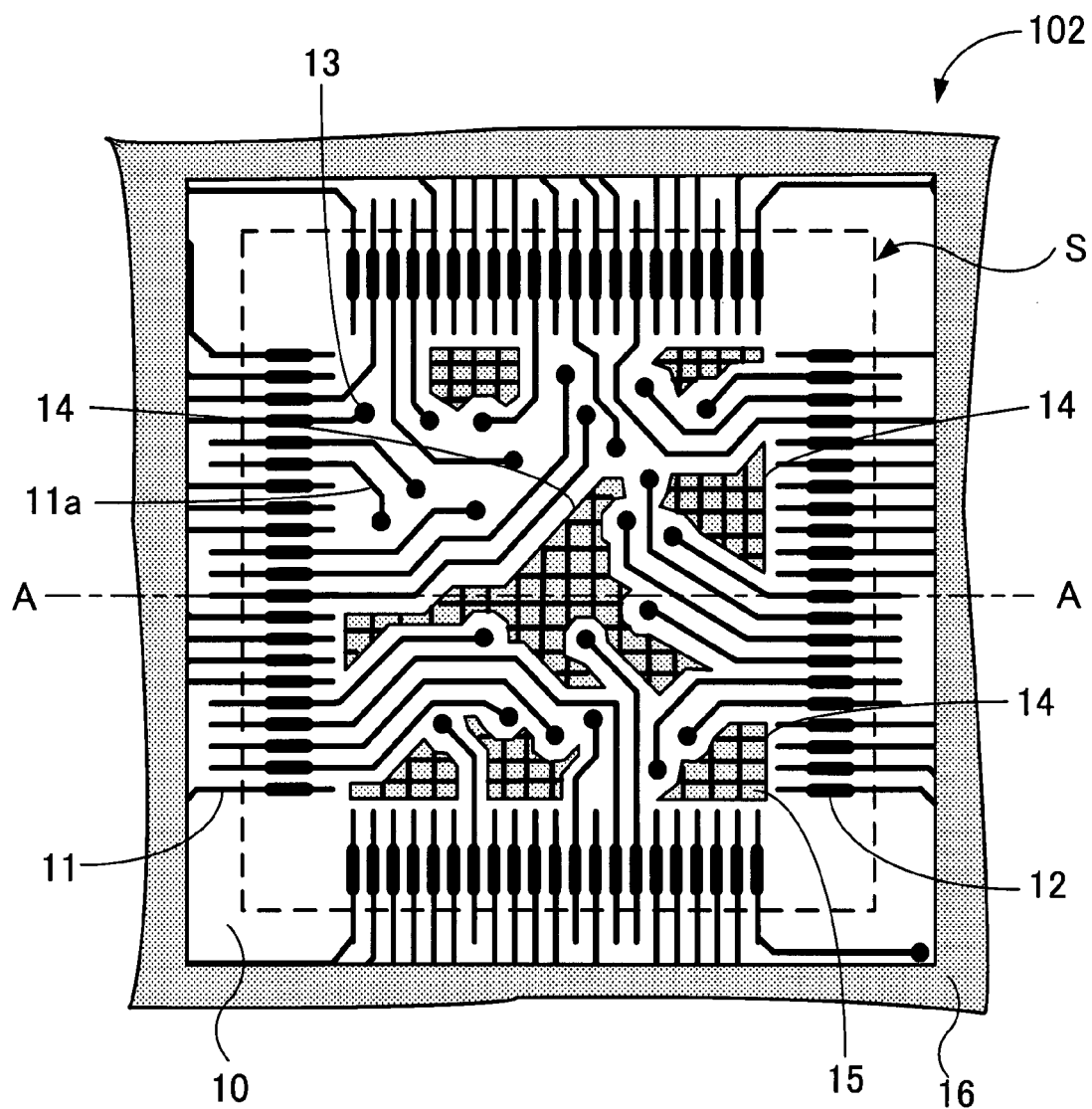
FIG. 7A is a plan of a circuit substrate according to a third embodiment of the present invention.
Figure 7B:
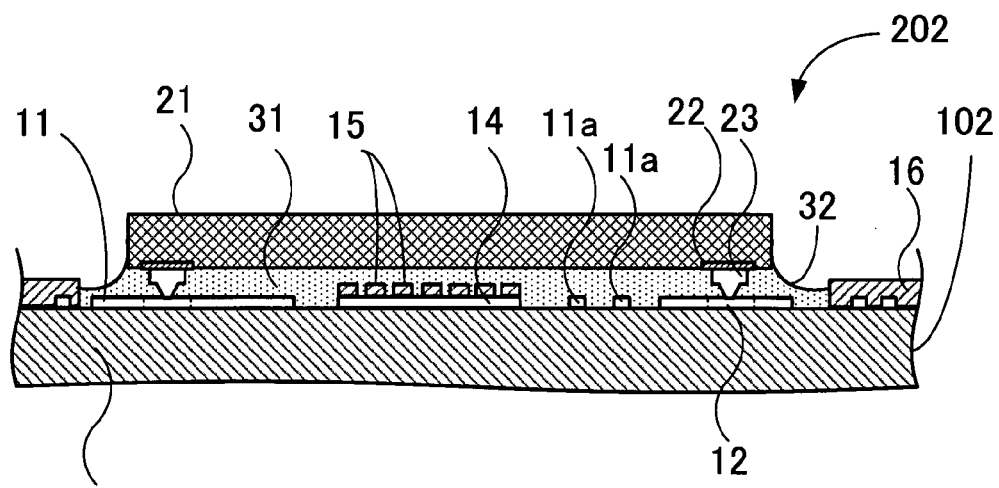
FIG. 7B is a cross-sectional view of a main part obtained when a semiconductor element is mounted to the circuit substrate.

FIG. 7A shows the structure of a circuit substrate 102 according to the third embodiment, and FIG. 7B shows a state in which a semiconductor element 21 is flip-chip (face-down) mounted over the circuit substrate 102 to make a semiconductor device 202. FIG. 7B is a cross-sectional view corresponding to that taken along line A-A in FIG. 7A.

In the semiconductor device 202 according to the third embodiment, insulating resin layers 15 are divided in a grating manner and disposed over island-shaped electrically conductive layers 14 selectively disposed over an insulating base member 10 of the circuit substrate 102. In other words, each insulating resin layer 15 is divided into a plurality of pieces and disposed over one island-shaped electrically conductive layer 14. If an island-shaped electrically conductive layer 14 has a small area, it may be not allowed to place a plurality of pieces of an insulating resin layer 15 thereon.

The third embodiment also has the same structure as the first embodiment except for how the insulating resin layers 15 are disposed over the island-shaped electrically conductive layers 14, and therefore, a detailed description of the same structure is omitted.

In the semiconductor device 202, which has the above-described structure, wiring layers 11 and the island-shaped electrically conductive layers 14 are selectively disposed at an element mounting area S in the circuit substrate 102.

The selective arrangement of the island-shaped electrically conductive layers 14 improves non-uniformity of the density of electrically conductive portions over the circuit substrate 102 and increases the rigidity of the circuit substrate 102 to reduce warpage or bow of the circuit substrate 102.

In the semiconductor device 202, since the insulating resin layers 15 are disposed over surfaces of the island-shaped electrically conductive layers 14, an adhesion material 31 contacts the insulating resin layers 15. The island-shaped electrically conductive layers 14 and the adhesion material 31 are strongly connected through the insulating resin layers 15, and delaminating does not occur between the island-shaped electrically conductive layers 14 and the adhesion material 31.

Since each insulating resin layer 15 is divided into a plurality of pieces and disposed over one island-shaped electrically conductive layer 14 in the semiconductor device 202, steps are formed between the plurality of pieces of the resin layer.

Therefore, when the adhesion material 31 is placed over the insulating base member 10 including the insulating resin layers 15, the contact performance of the adhesion material 31 and the insulating resin layers 15 is improved due to an increase in the contact area caused by the steps.

The adhesion material 31 can flow between the plurality of pieces due to the steps, the contact performance of the adhesion material 31 and the insulating resin layers 15 is further improved due to the so-called anchor effect.

The insulating resin layers 15 are divided in the grating manner to form a plurality of steps. The present invention is not limited to this case. The insulating resin layers 15 may be divided in a line and space manner or into portions having any necessary shape. Alternatively, a plurality of indentations may be formed in parallel in the insulating resin layers 15.

The division lines of the insulating resin layers 15 may be stopped at the middle in the thickness direction of the insulating resin layers 15, not reaching the surfaces of the island-shaped electrically conductive layers 14.

Since the insulating resin layers 15 are divided into a plurality of pieces in the above-described structure, the elastic recovery force of the insulating resin layers 15 is restricted when the semiconductor element 21 is mounted to the circuit substrate 102.

Consequently, a load applied to the semiconductor element 21 exceeds the elastic recovery force of the insulating resin layers 15 even if the load is not made large, and electrode connection sections 12 of the circuit substrate 102 and external-connection electrodes 23 of the semiconductor element 21 can be connected in a stable state.

Since the load applied to the semiconductor element 21 does not need to be made large, internal wirings or functional elements at portions where the external-connection electrodes 23 of the semiconductor element 21 are disposed are not damaged.

Therefore, even when the semiconductor element 21 is pressed against the circuit substrate 102 through the thermosetting adhesion material 31 with the load and heat supplied, the internal wirings or internal elements of the semiconductor element 21 are not damaged, and the electrode connection sections 12 of the circuit substrate 102 and the external-connection electrodes 23 of the semiconductor element 21 are reliably connected. In other words, the semiconductor device 202 has high reliability.

A fourth embodiment of the present invention will be described next.

Fourth Embodiment

A circuit substrate and a form in which a semiconductor element is mounted over the circuit substrate to make a semiconductor device, according to a fourth embodiment of the present invention will be described.

Figure 8A:
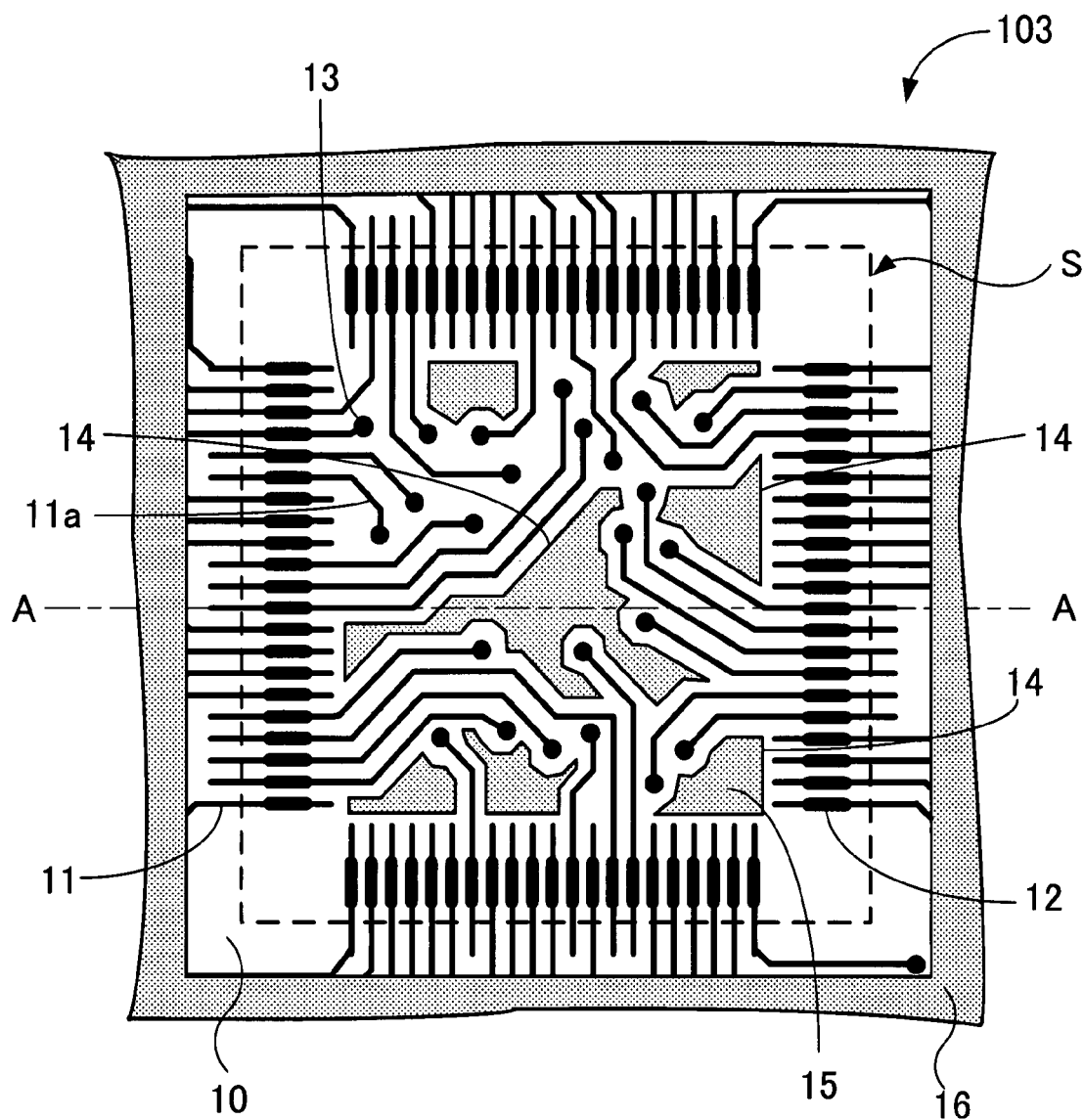
FIG. 8A is a plan of a circuit substrate according to a fourth embodiment of the present invention.
Figure 8B:
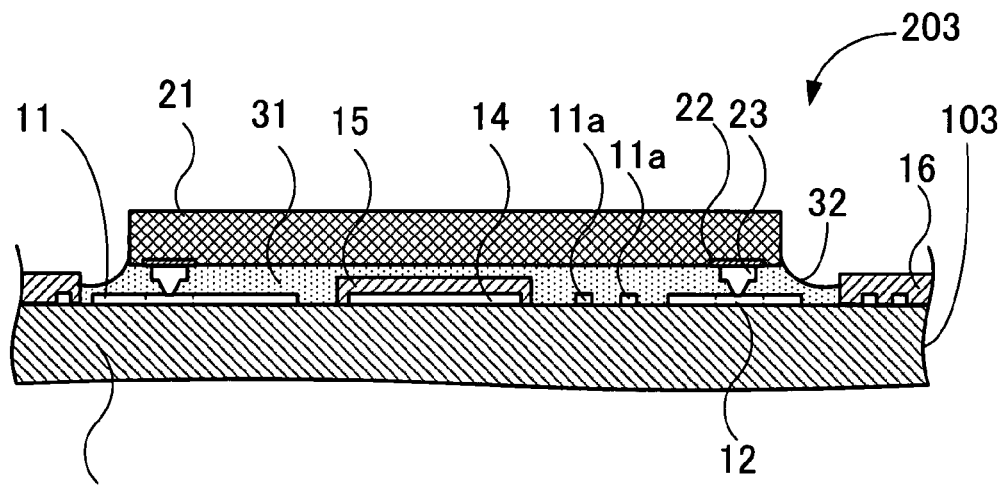
FIG. 8B is a cross-sectional view of a main part obtained when a semiconductor element is mounted to the circuit substrate.

FIG. 8A shows the structure of a circuit substrate 103 according to the fourth embodiment, and FIG. 8B shows a state in which a semiconductor element 21 is flip-chip (face-down) mounted over the circuit substrate 103 to make a semiconductor device 203. FIG. 8B is a cross-sectional view corresponding to that taken along line A-A in FIG. 8A.

In the semiconductor device 203 according to the fourth embodiment, insulating resin layers 15 are disposed over island-shaped electrically conductive layers 14 selectively disposed over an insulating base member 10 of the circuit substrate 103 to cover also the side faces of the island-shaped electrically conductive layers 14. In other words, each insulating resin layer 15 is disposed over one island-shaped electrically conductive layer 14 to cover the upper face and side face thereof and to reach the insulating base member 10.

The fourth embodiment also has the same structure as the first embodiment except for how the insulating resin layers 15 are disposed over the island-shaped electrically conductive layers 14, and therefore, a detailed description of the same structure is omitted.

In the semiconductor device 203, which has the above-described structure, wiring layers 11 and the island-shaped electrically conductive layers 14 are selectively disposed at an element mounting area S in the circuit substrate 103.

The selective arrangement of the island-shaped electrically conductive layers 14 improves non-uniformity of the density of electrically conductive portions over the circuit substrate 103 and increases the rigidity of the circuit substrate 103 to reduce warpage or bow of the circuit substrate 103.

In the semiconductor device 203, since the insulating resin layers 15 are disposed over the surfaces of the island-shaped electrically conductive layers 14, an adhesion material 31 contacts the insulating resin layers 15. The island-shaped electrically conductive layers 14 and the adhesion material 31 are strongly connected through the insulating resin layers 15, and delaminating does not occur between the island-shaped electrically conductive layers 14 and the adhesion material 31.

In the semiconductor device 203, which has the above-described structure, the insulating resin layers 15 disposed over the island-shaped electrically conductive layers 14 also cover the side faces thereof and reach the surface of the insulating base member 10.

Therefore, when the adhesion material 31 is placed over the insulating base member 10 including the insulating resin layers 15, the contact performance of the adhesion material 31 and the insulating resin layers 15 is further improved due to an increase in the contact area at the side faces of the island-shaped electrically conductive layers 14.

Since the area of the insulating resin layers 15 is not greatly increased in the above-described structure, the elastic recovery force of the insulating resin layers 15 is restricted when the semiconductor element 21 is mounted to the circuit substrate 103.

Consequently, a load applied to the semiconductor element 21 exceeds the elastic recovery force of the insulating resin layers 15 even if the load is not made large, and electrode connection sections 12 of the circuit substrate 103 and external-connection electrodes 23 of the semiconductor element 21 can be connected in a stable state.

Since the load applied to the semiconductor element 21 does not need to be made large, internal wirings or functional elements at portions where the external-connection electrodes 23 of the semiconductor element 21 are disposed are not damaged.

Therefore, even when the semiconductor element 21 is pressed against the circuit substrate 103 through the thermo-setting adhesion material 31 with the load and heat supplied, the internal wirings or internal elements of the semiconductor element 21 are not damaged, and the electrode connection sections 12 of the circuit substrate 103 and the external-connection electrodes 23 of the semiconductor element 21 are reliably connected. In other words, the semiconductor device 203 has high reliability.

A fifth embodiment of the present invention will be described next.

Fifth Embodiment

A circuit substrate and a form in which a semiconductor element is mounted over the circuit substrate to make a semiconductor device, according to a fifth embodiment of the present invention will be described.

Figure 9A:
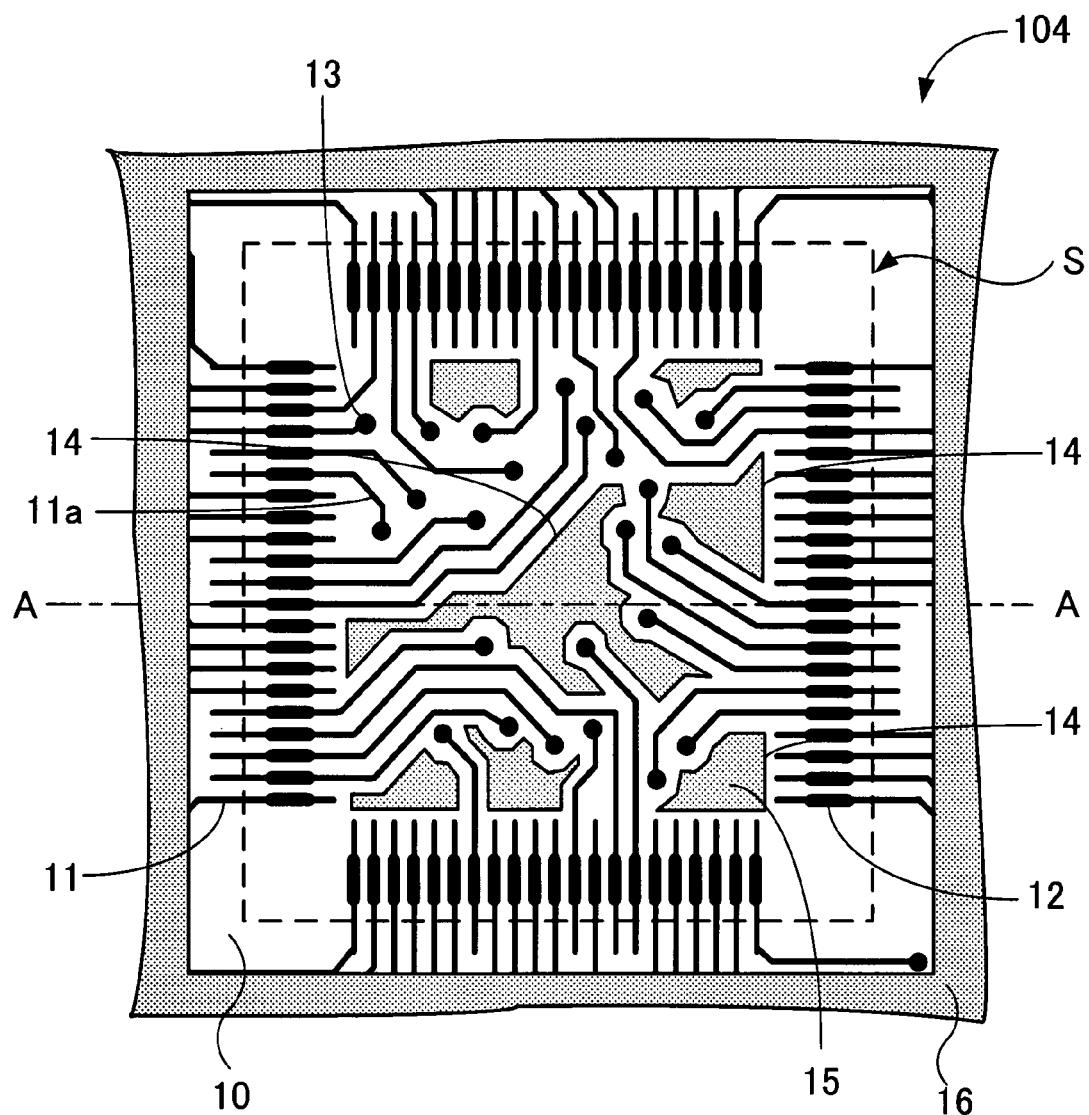
FIG. 9A is a plan of a circuit substrate according to a fifth embodiment of the present invention.
Figure 9B:
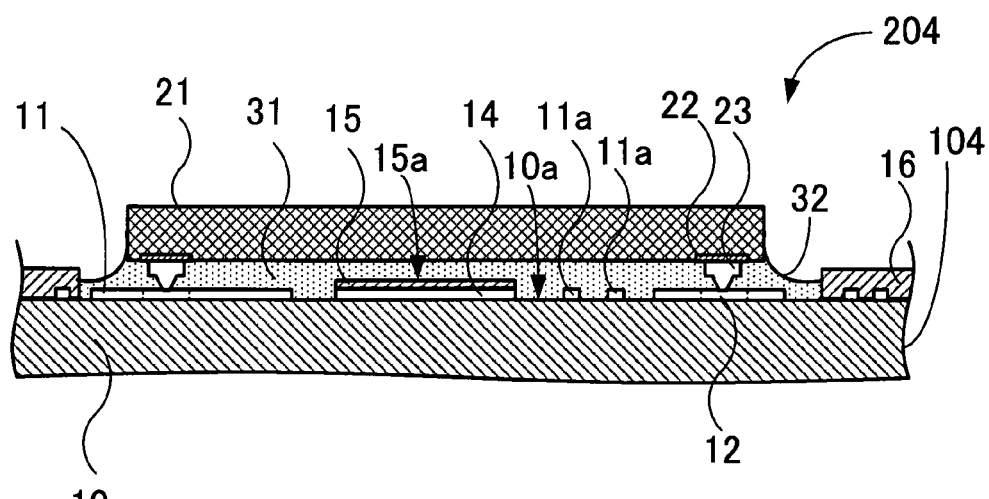
FIG. 9B is a cross-sectional view of a main part obtained when a semiconductor element is mounted to the circuit substrate.

FIG. 9A shows the structure of a circuit substrate 104 according to the fifth embodiment, and FIG. 9B shows a state in which a semiconductor element 21 is flip-chip (face-down) mounted over the circuit substrate 104 to make a semiconductor device 204. FIG. 9B is a cross-sectional view corresponding to that taken along line A-A in FIG. 9A.

In the semiconductor device 204 according to the fifth embodiment, insulating resin layers 15 thinner than in the first embodiment are disposed over island-shaped electrically conductive layers 14 selectively disposed over an insulating base member 10 of the circuit substrate 104. In other words, the insulating resin layers 15 are disposed over the island-shaped electrically conductive layers 14 with a relatively small thickness.

The height from a surface 10a of the insulating base member 10 to a surface 15a of the insulating resin layers 15 is made smaller than the height of a solder-resist layer 16 disposed at the perimeter of an element mounting area S.

More specifically, the thickness of the insulating resin layers 15 is set to 2 to 10 μm in the present embodiment whereas the thickness is 5 to 30 μm in the first to fourth embodiments.

The fifth embodiment also has the same structure as the first embodiment except for how the insulating resin layers 15 are disposed over the island-shaped electrically conductive layers 14, and therefore, a detailed description of the same structure is omitted.

In the semiconductor device 204, which has the above-described structure, wiring layers 11 and the island-shaped electrically conductive layers 14 are selectively disposed at the element mounting area S in the circuit substrate 104.

The selective arrangement of the island-shaped electrically conductive layers 14 improves non-uniformity of the density of electrically conductive portions over the circuit substrate 104 and increases the rigidity of the circuit substrate 104 to reduce warpage or bow of the circuit substrate 104.

In the semiconductor device 204, since the insulating resin layers 15 are disposed over the surfaces of the island-shaped electrically conductive layers 14, an adhesion material 31 contacts the insulating resin layers 15. The island-shaped electrically conductive layers 14 and the adhesion material 31 are strongly connected through the insulating resin layers 15, and delaminating does not occur between the island-shaped electrically conductive layers 14 and the adhesion material 31.

Since the insulating resin layers 15 are made thinner in the above-described structure, the elastic recovery force of the insulating resin layers 15 is restricted to a low level when the semiconductor element 21 is mounted to the circuit substrate 104.

Consequently, a load applied to the semiconductor element 21 exceeds the elastic recovery force of the insulating resin layers 15 even if the load is not made large, and electrode connection sections 12 of the circuit substrate 104 and external-connection electrodes 23 of the semiconductor element 21 can be connected in a stable state.

Since the load applied to the semiconductor element 21 does not need to be made large, internal wirings or functional elements at portions where the external-connection electrodes 23 of the semiconductor element 21 are disposed are not damaged.

Therefore, even when the semiconductor element 21 is pressed against the circuit substrate 104 through the thermosetting adhesion material 31 with the load and heat supplied, the internal wirings or internal elements of the semiconductor element 21 are not damaged, and the electrode connection sections 12 of the circuit substrate 104 and the external-connection electrodes 23 of the semiconductor element 21 are reliably connected.

In addition, since the insulating resin layers 15 are made thinner, the space between the insulating resin layers 15 and the semiconductor element 21 is extended to increase the flowability of the adhesion material 31. A void is prevented from being produced in the adhesion material 31 or is reduced, and a portion which is not filled with the adhesion material 31 is prevented from being generated or is reduced.

Therefore, the reliability of the semiconductor device 204 is increased.

Comparison with the Related Art

A comparison in advantages between the present invention and the related art will be described below.

A semiconductor device A having island-shaped electrically conductive layers 14 but not having insulating resin layers 15 thereover, according to the related art and a semiconductor device B having island-shaped electrically conductive layers 14 and also having insulating resin layers 15 thereover, according to the concept of the present invention were environmentally evaluated in a moisture/reflow sensitivity test and an autoclave test to compare the reliability of the semiconductor devices.

As a semiconductor element 21 to be mounted to the semiconductor device A and the semiconductor device B, a logic integrated-circuit element having dimensions of 6.57 by 6.57 mm, an electrode-pad pitch of 50 μm (minimum pitch), 414 electrode pads, and external-connection terminals made from gold (Au) was used.

The circuit substrate having the structure shown in FIG. 1 was used except for the insulating resin layers 15. As the insulating base member 10, a four-layer buildup wiring substrate made from glass-BT was used.

The island-shaped electrically conductive layers 14 were set to have the ground potential. A paste-like thermosetting insulating epoxy resin was used as the adhesion material 31.

In the semiconductor device A, insulating resin layers 15 were not disposed over the island-shaped electrically conductive layers 14, but a nickel (Ni) layer first and then a gold (Au) layer were disposed over the island-shaped electrically conductive layers 14. These metal layers were formed by the plating method.

In contrast, in the semiconductor device B, the insulating resin layers 15 made from the same material as solder resist were disposed over the island-shaped electrically conductive layers 14, and then, a nickel (Ni) layer first and then a gold (Au) layer were disposed over exposed wiring patterns, electrode connection sections, and the island-shaped electrically conductive layers 14.

The semiconductor devices A and B were flip-chip mounted to the circuit substrates by an adhesive-intervening-type thermocompression bonding method.

In mounting conditions, a load was set to 17 gf/bump, the heating temperature of the semiconductor elements was set to 280° C., and the heating temperature of the circuit substrates was set to 70° C. The bonding time was five seconds.

Ten samples of each of the semiconductor devices A and B having a structure similar to that shown in FIG. 5 were manufactured in the foregoing way and their performance was compared.

The results of the moisture/reflow sensitivity test will be described first.

The ten samples of each of the semiconductor devices A and B were left in an environment having a temperature of 30° C. and a relative humidity of 80% for 120 hours, and then were applied heating treatment at a peak temperature of 260° C. in an infrared reflow apparatus.

Then, the ten samples were left in an environment having a temperature of 30° C. and a relative humidity of 80% for 96 hours, and then were subjected to heating treatment at a peak temperature of 260° C. in the infrared reflow apparatus.

The samples were visually inspected at their insides, and were further checked for their electric characteristics.

In the inside visual inspection, whether delamination occurred at the interface between the adhesion material 31 and the semiconductor element 21 and the interfaces between the adhesion material 31, and the base member 10 of the circuit substrate, the island-shaped electrically conductive layers 14, wiring patterns 11, and external-connection electrodes 23 by using an ultrasonic flaw detector.

In the inside visual inspection, no defects were found in any of the ten samples of each of the semiconductor devices A and B.

In the electric-characteristics check, according to a predetermined test program, the samples were electrically operated, and the electrical characteristics thereof were measured to check whether predetermined characteristics were obtained.

In the electric-characteristics check, no defects were found in any of the ten samples of each of the semiconductor devices A and B.

After the moisture/reflow sensitivity test, the autoclave test was conducted. The results thereof will be described below. In the autoclave test, the samples were left in an environment having a temperature of 121° C. and a relative humidity of 99.8% for a predetermined period of time.

Then, the samples were checked for their electric characteristics. If a defect was found in the electric-characteristics check, that sample was visually inspected at its inside.

The same methods as those in the moisture/reflow sensitivity test were used for the electric-characteristic check and inside visual inspection in this test.

In the electric-characteristic check, no defect was found in the ten samples of the semiconductor device A for up to 504 hours and in the ten samples of the semiconductor device B for up to 840 hours.

Defects were found in five of the ten samples of the semiconductor device A in 672 hours and two of the ten samples of the semiconductor device B in 1,008 hours in their electric characteristics.

In the inside visual inspection, delaminating was found in all of the samples in which defects were found in their electric characteristics, of the semiconductor devices A and B.

Delaminating was found in the interface between the semiconductor element 21 and the adhesion material 31 in a vicinity of the perimeter of the semiconductor element 21, and the interface with the adhesion material 31 over and in a vicinity of the island-shaped electrically conductive layers 14, in the samples of the semiconductor device A.

In the samples of the semiconductor device B, delaminating was found in the interface between the semiconductor element 21 and the adhesion material 31 in a vicinity of an outer corner of the semiconductor element 21. No delaminating of the adhesion material 31 occurred over the island-shaped electrically conductive layers 14.

From the above-described environmental evaluation, it was confirmed that the semiconductor device B, according to the present invention, has higher reliability than the semiconductor device A, having a conventional structure.

Any of the first to fifth embodiments of the present invention can be selected and combined.

The present invention is not limited to cases where one of the first to fifth embodiments, described above, is applied to all of a plurality of island-shaped electrically conductive layers 14 disposed at an element mounting area in a circuit substrate. The present invention can be applied to only island-shaped electrically conductive layers 14 having larger areas.

In addition, one of the first to fifth embodiments can be applied to one of insulating resin layers 15 disposed over a plurality of island-shaped electrically conductive layers 14.

In a circuit substrate according to the present invention, since island-shaped electrically conductive layers are disposed separately and apart from wiring layers at an element mounting area in the circuit substrate, non-uniformity of the density of electrically conductive portions in the circuit substrate is improved and the rigidity of the circuit substrate is increased to reduce warpage or bow of the circuit substrate.

In a circuit substrate and a semiconductor device according to the present invention, since resin layers are disposed over the surfaces of island-shaped electrically conductive layers in the circuit substrate, an adhesion material for securing a semiconductor element contacts the resin layers. With this structure, the island-shaped electrically conductive layers and the adhesion material are strongly connected through the resin layers, and delaminating does not occur between the island-shaped electrically conductive layers and the adhesion material.

As described above, according to the present embodiment, delaminating of wiring layers inside a semiconductor device is prevented; and a connection defect is prevented between electrode connection sections of a circuit substrate and external-connection electrodes of a semiconductor element. Therefore, a highly reliable circuit substrate and a semiconductor device using the circuit substrate can be implemented.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A circuit substrate over which a semiconductor element is flip-chip mounted, comprising:
    a wiring layer disposed in an area opposite a surface of the semiconductor element where an electrode of the semiconductor element is disposed;
    an electrically conductive layer disposed apart from the wiring layer in the area; and
    a resin layer disposed over the electrically conductive layer;
    wherein the height from a surface of a base member, constituting the circuit substrate, to a surface of the resin layer, is lower than the height of solder resist disposed at a perimeter portion of the area.

2. The circuit substrate according to claim 1, wherein the resin layer is disposed only over the electrically conductive layer.

3. The circuit substrate according to claim 1, wherein the electrically conductive layer is made from copper (Cu), and two metal layers of a nickel (Ni) layer and a gold (Au) layer are formed in that order from the lower layer over a surface of the electrically conductive layer.

4. The circuit substrate according to claim 1, wherein the resin layer, disposed over the electrically conductive layer, also covers a side face of the electrically conductive layer.

5. The circuit substrate according to claim 1, wherein the resin layer, disposed over the electrically conductive layer, is divided into a plurality of pieces and disposed.

6. The circuit substrate according to claim 1, wherein the resin layer, disposed over the electrically conductive layer, is formed to have a smaller area than the electrically conductive layer so as to expose an upper edge surface of the electrically conductive layer.

7. The circuit substrate according to claim 6, wherein a width of the upper edge surface exposed is the same as a width of a wire of the wiring layer.

8. A semiconductor device comprising:
    a semiconductor element;
    a circuit substrate over which the semiconductor element is flip-chip mounted, comprising a wiring layer disposed in an area opposite a surface of the semiconductor element where an electrode of the semiconductor element is disposed, an electrically conductive layer disposed apart from the wiring layer in the area, and a resin layer disposed over the electrically conductive layer; and
    an adhesion material disposed between the circuit substrate and the semiconductor element; wherein
    the height from a surface of a base member, constituting the circuit substrate, to a surface of the resin layer, is lower than the height of solder resist disposed at a perimeter portion of the area.

9. The semiconductor device according to claim 8, wherein the resin layer is disposed only over the electrically conductive layer.

10. The semiconductor device according to claim 8, wherein the electrically conductive layer is made from copper (Cu), and two metal layers of a nickel (Ni) layer and a gold (Au) layer are formed in that order from the lower layer over a surface of the electrically conductive layer.

11. The semiconductor device according to claim 8, wherein the resin layer, disposed over the electrically conductive layer, also covers a side face of the electrically conductive layer.

12. The semiconductor device according to claim 8, wherein the resin layer, disposed over the electrically conductive layer, is divided into a plurality of pieces and disposed.

13. The semiconductor device according to claim 8, wherein the resin layer, disposed over the electrically conductive layer, is formed to have a smaller area than the electrically conductive layer so as to expose an upper edge surface of the electrically conductive layer.

14. The semiconductor device according to claim 13, wherein a width of the upper edge surface exposed is the same as a width of a wire of the wiring layer.

15. The semiconductor device according to claim 8, wherein the electrically conductive layer has a ground potential.

* * * * *